US012764944B2

(12) United States Patent
Han

(10) Patent No.: US 12,764,944 B2
(45) Date of Patent: Oct. 13, 2026

(54) SEMICONDUCTOR STRUCTURE, METHOD FOR FORMING SEMICONDUCTOR STRUCUTRE, AND MEMORY

(71) Applicant: CHANGXIN MEMORY TECHNOLOGIES, INC., Hefei City (CN)

(72) Inventor: Qinghua Han, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 466 days.

(21) Appl. No.: 18/366,819

(22) Filed: Aug. 8, 2023

(65) Prior Publication Data

US 2024/0074164 A1 Feb. 29, 2024

Related U.S. Application Data

(63) Continuation of application No. PCT/CN2022/124071, filed on Oct. 9, 2022.

(30) Foreign Application Priority Data

Aug. 24, 2022 (CN) ........................ 202211024239.3

(51) Int. Cl.
*H10B 12/00* (2023.01)
*H10D 64/27* (2025.01)

(52) U.S. Cl.
CPC ........... *H10B 12/488* (2023.02); *H10B 12/02* (2023.02); *H10B 12/482* (2023.02); *H10D 64/513* (2025.01)

(58) Field of Classification Search
CPC .... H10B 12/488; H10B 12/02; H10B 12/482; H10B 12/05; H10D 64/513
See application file for complete search history.

(56) References Cited

U.S. PATENT DOCUMENTS

| | | | |
|---|---|---|---|
| 8,896,059 B1 | 11/2014 | Kim | |
| 2012/0132982 A1 | 5/2012 | Lee | |

(Continued)

FOREIGN PATENT DOCUMENTS

| | | |
|---|---|---|
| CN | 102479811 A | 5/2012 |
| CN | 104269381 A | 1/2015 |

(Continued)

OTHER PUBLICATIONS

Extended European search report in application No. 22924575, mailed on Jul. 12, 2024.

(Continued)

*Primary Examiner* — Yasser A Abdelaziez
(74) *Attorney, Agent, or Firm* — Syncoda LLC; Feng Ma

(57) ABSTRACT

A semiconductor structure, a method for forming a semiconductor structure, and a memory are provided. The method for forming the semiconductor structure in the disclosure includes: providing a base, the base including a substrate and an insulating dielectric layer, the substrate including a plurality of first trenches spaced apart from each other in a first direction, and the insulating dielectric layer being filled in each of the plurality of first trenches; patterning and etching the base to form a plurality of second trenches spaced apart from each other in a second direction, the second direction intersecting with the first direction; forming a word line structure in each of the plurality of second trenches; forming an air gap between each two adjacent word line structures of a plurality of word line structures; and sealing the air gap.

7 Claims, 10 Drawing Sheets

(56) References Cited

U.S. PATENT DOCUMENTS

| | | | | |
|---|---|---|---|---|
| 2015/0236111 | A1 | 8/2015 | Lee | |
| 2016/0380060 | A1 * | 12/2016 | Kim | H10D 30/025 438/586 |
| 2020/0020697 | A1 * | 1/2020 | Kim | H10B 12/482 |
| 2021/0407908 | A1 * | 12/2021 | Huang | H10B 12/0335 |
| 2022/0029015 | A1 * | 1/2022 | Simsek-Ege | H10D 30/63 |
| 2023/0020173 | A1 * | 1/2023 | Xiao | H10B 12/05 |
| 2023/0116971 | A1 | 4/2023 | Yang et al. | |

FOREIGN PATENT DOCUMENTS

| | | | |
|---|---|---|---|
| CN | 104347379 | A | 2/2015 |
| CN | 106952919 | A | 7/2017 |
| CN | 211555887 | U | 9/2020 |
| CN | 114420644 | A | 4/2022 |
| CN | 114864504 | A | 8/2022 |
| WO | 2021169786 | A1 | 9/2021 |

OTHER PUBLICATIONS

International Search Report in the international application No. PCT/CN2022/124071, mailed on Dec. 21, 2022. 4 pages.

* cited by examiner

SEMICONDUCTOR STRUCTURE, METHOD FOR FORMING SEMICONDUCTOR STRUCUTRE, AND MEMORY

CROSS-REFERENCE TO RELATED APPLICATIONS

This is a continuation application of International Patent Application No. PCT/CN2022/124071, filed on Oct. 9, 2022, which claims priority to Chinese Patent Application No. 202211024239.3, filed on Aug. 24, 2022 and entitled "SEMICONDUCTOR STRUCTURE, METHOD FOR FORMING SEMICONDUCTOR STRUCTURE, AND MEMORY". The disclosures of International Patent Application No. PCT/CN2022/124071 and Chinese Patent Application No. 202211024239.3 are incorporated by reference herein in their entireties.

BACKGROUND

With continuous development of mobile devices, mobile devices with battery power supply, such as mobile phones, tablet computers and wearable devices, are increasingly used in daily life. As an essential component in mobile devices, there is a huge demand for the small dimension and integration of the memory.

At present, Dynamic Random Access Memory (DRAM) is widely used in mobile devices due to its high transmission speed. However, as the volume of semiconductor device continues to reduce, there are more and more word line structures in the unit area, so that the spacing between the word line structures becomes smaller, and thus the parasitic capacitance between the word line structures is increased, and the power consumption of the semiconductor structures is also increased.

It should be noted that the above information disclosed in the Background section is only for enhancement of understanding of the background of the disclosure, and therefore it may contain information that does not constitute the related art that is already known to a person of ordinary skill in the art.

SUMMARY

The disclosure relates to the technical field of semiconductors, in particular to a semiconductor structure, a method for forming a semiconductor structure, and a memory.

In view of this, the disclosure provides a semiconductor structure, a method for forming a semiconductor structure, and a memory, which may reduce the parasitic capacitance and power consumption, and improve the product stability.

According to an aspect of the disclosure, a method for forming a semiconductor structure is provided. The method includes the following operations.

A base is provided, in which the base includes a substrate and an insulating dielectric layer, the substrate includes a plurality of first trenches spaced apart from each other in a first direction, and the insulating dielectric layer is filled in each of the plurality of first trenches.

The base is patterned and etched to form a plurality of second trenches spaced apart from each other in a second direction, in which the second direction intersects with the first direction.

A word line structure is formed in each of the plurality of second trenches.

An air gap is formed between each two adjacent word line structures of a plurality of word line structures.

The air gap is sealed.

According to an aspect of the disclosure, a semiconductor structure is provided. The semiconductor structure includes a base, a plurality of word line structures, and a sealing layer.

The base includes a substrate and an insulating dielectric layer, the substrate includes a plurality of first trenches spaced apart from each other in a first direction and a plurality of second trenches spaced apart from each other in a second direction, the insulating dielectric layer is filled in each of the plurality of first trenches, each of the plurality of second trenches penetrates through each of the plurality of first trenches and the insulating dielectric layer inside each of the plurality of first trenches, and the second direction intersects with the first direction.

Each of the plurality of word line structures is formed in a respective one of the plurality of second trenches, and an air gap is formed between each two adjacent word line structures of the plurality of word line structures.

The sealing layer at least covers an opening of the air gap.

According to an aspect of the disclosure, a memory is provided. The memory includes a semiconductor structure. The semiconductor structure includes a base, a plurality of word line structures, and a sealing layer.

The base includes a substrate and an insulating dielectric layer, the substrate includes a plurality of first trenches spaced apart from each other in a first direction and a plurality of second trenches spaced apart from each other in a second direction, the insulating dielectric layer is filled in each of the plurality of first trenches, each of the plurality of second trenches penetrates through each of the plurality of first trenches and the insulating dielectric layer inside each of the plurality of first trenches, and the second direction intersects with the first direction.

Each of the plurality of word line structures is formed in a respective one of the plurality of second trenches, and an air gap is formed between each two adjacent word line structures of the plurality of word line structures.

The sealing layer at least covers an opening of the air gap.

It should be understood that the foregoing general description and the detailed description below are merely exemplary and explanatory, and do not limit the disclosure.

BRIEF DESCRIPTION OF THE DRAWINGS

The accompanying drawings herein are incorporated in and constitute a part of this specification, illustrate embodiments conforming to the disclosure, and, together with the specification, serve to explain the principles of the disclosure. It is apparent that the accompanying drawings described below are only some embodiments of the disclosure, and persons of ordinary skill in the art may still derive other drawings from these accompanying drawings without creative efforts.

DESCRIPTION OF REFERENCE NUMERALS

Figure 1:
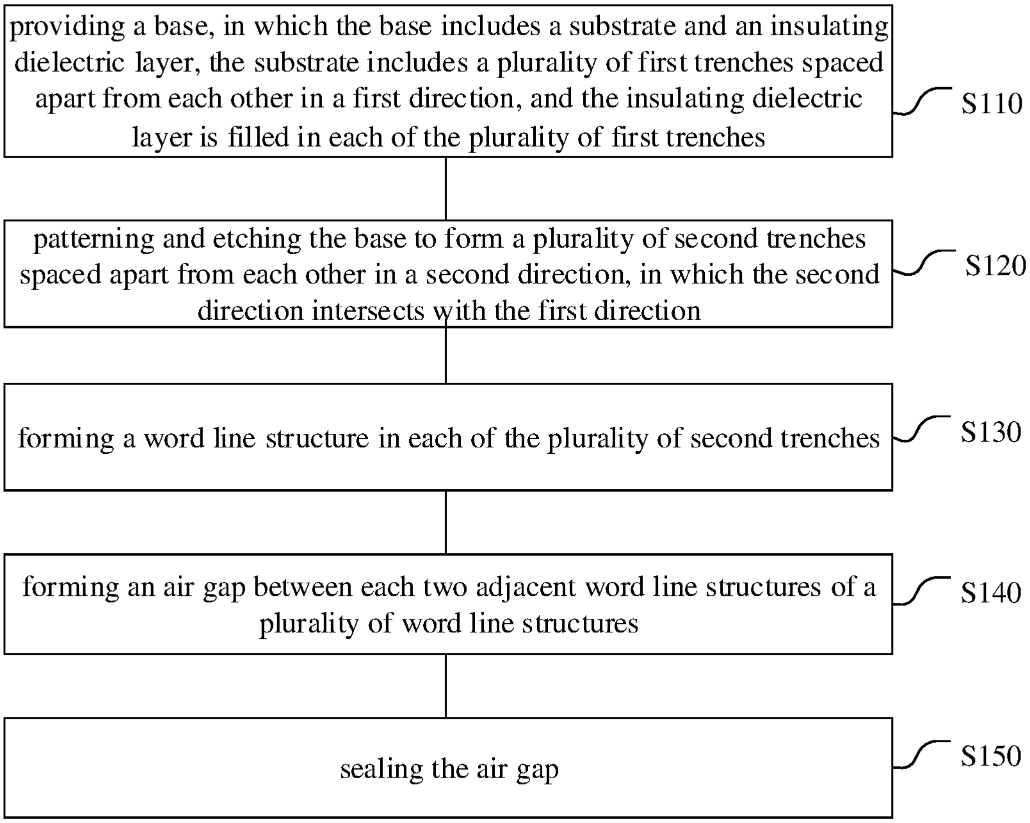
FIG. 1 is a flowchart of a method for forming a semiconductor structure according to an embodiment of the disclosure.

1. Base; 11. Substrate; 12. Insulating dielectric layer; 101. Second trench; 110. Supporting pillar; 2. Word line structure; 21. Inter-gate dielectric layer; 22. First conductive material; 201. Word line filling trench; 3. Insulating layer; 31. Protective layer; 32. First insulating layer; 33. Passivation layer; 331. Second insulating layer; 3311. First insulating material layer; 301. Air gap; 302. Insulating gap; 4. Sealing layer; 5. Bit line structure; 6. Mask layer; A. First direction; B. Second direction.

DETAILED DESCRIPTION

The exemplary embodiments will now be described more comprehensively with reference to the accompanying drawings. However, the exemplary embodiments may be implemented in a variety of forms and should not be construed as being limited to embodiments illustrated herein. Rather, these embodiments are provided to make the disclosure comprehensive and complete and the concepts of the exemplary embodiments will be conveyed fully to those of ordinary skill in the art. Same reference numerals in the drawings denote the same or similar structures, and thus their detailed description will be omitted. In addition, the drawings are only schematic illustrations of the disclosure and are not necessarily drawn to scale.

Although relative terms, such as "above" and "below" are used in this specification to describe a relative relationship of one component to another component shown in the drawings, these terms are used in this specification for convenience only, for example, according to the directions of the examples illustrated in the drawings. It can be understood that if the device shown in the drawings is flipped upside down, the component described "above" will become the component "below". When a structure is located "on" another structure, it may mean that a structure is integrally formed on another structure, or that a structure is "directly" disposed on another structure, or that a structure is "indirectly" disposed on another structure through the other structures.

The terms "a", "an", "the", "said" and "at least one" are used to indicate the existence of one or more elements/components/etc. The terms "include" and "have" are used to indicate an open meaning of including and means that there may be additional elements/components/etc. in addition to the listed elements/components/etc. The terms "first", "second" and "third" are used only as symbols and are not intended to limit the number of the objects.

Embodiments of the disclosure provide a method for forming a semiconductor structure. FIG. 1 shows a flowchart of a method for forming a semiconductor structure in the disclosure. With reference to FIG. 1, the method may include S110 to S150.

In S110, a base is provided, in which the base includes a substrate and an insulating dielectric layer, the substrate includes a plurality of first trenches spaced apart from each other in a first direction, and the insulating dielectric layer is filled in each of the plurality of first trenches.

In S120, the base is patterned and etched to form a plurality of second trenches spaced apart from each other in a second direction, in which the second direction intersects with the first direction.

In S130, a word line structure is formed in each of the plurality of second trenches.

In S140, an air gap is formed between each two adjacent word line structures of a plurality of word line structures.

In S150, the air gap is sealed.

According to the method for forming the semiconductor structure in the disclosure, on the one hand, the second trench is formed in the substrate, and the word line structure is buried in the second trench, which is beneficial to save the structure space, and to improve the device integration. On the other hand, an air gap may be formed between two adjacent word line structures. Due to the smaller dielectric constant of the air gap, the parasitic capacitance between the word line structures can be effectively reduced, and the power consumption of devices can be reduced. On still the other hand, the air gap can be sealed between two adjacent word line structures by sealing the air gap, so as to prevent the resulting semiconductor structure from breaking at the opening of the air gap, thereby improving the product yield.

Hereinafter, specific details of the method for forming the semiconductor structure in embodiments of the disclosure will be described in detail.

As shown in FIG. 1, in S110, a base is provided, in which the base includes a substrate and an insulating dielectric layer, the substrate includes a plurality of first trenches spaced apart from each other in a first direction, and the insulating dielectric layer is filled in each of the plurality of first trenches.

Figure 2:
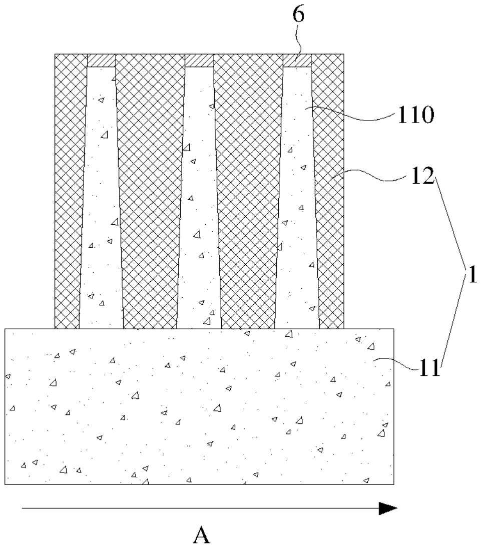
FIG. 2 is a schematic diagram of a base according to an embodiment of the disclosure.

In an exemplary embodiment of the disclosure, as shown in FIG. 2, the base 1 may include a substrate 11 and an insulating dielectric layer 12. A plurality of first trenches (not shown in the figure) spaced apart from each other in a first direction A may be provided in the substrate 11. Each of the plurality of first trenches may extend in a second direction B. The first trench may have a slot-like structure formed by an inward concave surface of the substrate 11, and the first trench may penetrate through both ends of the substrate 11.

The first direction A may intersect with the second direction B. For example, the first direction A may be perpendicular to the second direction B. It should be noted that "perpendicular" may be absolutely perpendicular or approximately perpendicular. Deviation is inevitable in the manufacturing process. In the disclosure, the angle between the first direction A and the second direction B may be deviated due to the angle deviation caused by the manufacturing process limitation. As long as the angle deviation between the first direction A and the second direction B is within a preset range, the first direction A can be considered perpendicular to the second direction B. For example, the preset range may be 10°, that is, the first direction A may be considered perpendicular to the second direction B when the angle between the first direction A and the second direction B is greater than or equal to 80°, or less than or equal to 100°.

Each of the first trenches can be filled with an insulating material to form the insulating dielectric layer 12. Each of the first trenches may be completely filled with the insulating dielectric layer 12, and an upper surface of the insulating dielectric layer 12 may be flush with an upper surface of the substrate 11.

In an exemplary embodiment of the disclosure, the operation that the base 1 is provided, in which the base 1 includes the substrate 11 and the insulating dielectric layer 12, the substrate 11 includes the plurality of first trenches spaced apart from each other in the first direction A, and the insulating dielectric layer 12 is filled in each of the plurality of first trenches (i.e. S110) may include S210 to S230.

In S210, the substrate 11 is provided.

The substrate 11 may have a flat structure, which may be of a rectangular, circular, elliptical, polygonal or irregular shape. The material of the substrate may be silicon or other semiconductor materials. The shape and the material of the substrate 11 are not specifically limited herein.

In S220, the substrate 11 is etched to form the plurality of first trenches spaced apart from each other, in which each of the plurality of first trenches extends in the second direction B, and the plurality of first trenches are spaced apart from each other in the first direction A.

The plurality of first trenches may be formed within the substrate 11 by a photolithography process. Each of the plurality of first trenches may extend in the second direction B, and the plurality of first trenches may be spaced apart from each other in the first direction A. For example, a photoresist layer may be formed on the surface of the substrate 11 by spin coating or other methods. The material of the photoresist layer may be a positive photoresist or a negative photoresist, which is not specifically limited herein. The shape of the surface of the photoresist layer away from the substrate 11 may be the same as the shape of the surface of the substrate 11. The photoresist layer may be exposed by using a mask, in which the pattern of the mask can match to a pattern required for each of the first trenches. Subsequently, the exposed photoresist layer may be developed to form a developing region. The developing region may expose the substrate 11, and the pattern of the developing region may be the same as the pattern required for the first trench, and the dimension of the developing region may be the same as the dimension required for the first trench. The substrate 11 may be anisotropic etched in the developing region to form each of the first trenches. It should be noted that, the first trench does not penetrate through the substrate 11 in a direction perpendicular to the substrate 11, that is, the material of the substrate 11 is still retained at the bottom portion of the first trench.

In S230, an insulating material is filled in each of the plurality of first trenches to form the insulating dielectric layer 12.

The insulating material may be filled in each first trench by vacuum evaporation, magnetron sputtering, chemical vapor deposition, physical vapor deposition, atomic layer deposition or the like, and all the first trenches may be completely filled with the insulating material. In an embodiment, the insulating material may be an oxide, for example, silicon oxide.

As shown in FIG. 1, in S120, the base is patterned and etched to form the plurality of second trenches spaced apart from each other in the second direction B, in which the second direction B intersects with the first direction A.

Figure 3:
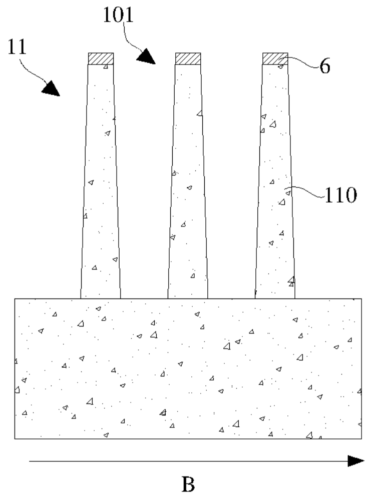
FIG. 3 is a schematic diagram of a base according to an embodiment of the disclosure taken along a second direction.

The base 1 may be etched to form, within the base 1, a plurality of second trenches 101 spaced apart from each other. As shown in FIG. 3, each of the plurality of second trenches 101 may extend in the first direction A, and the plurality of second trenches 101 may be spaced apart from each other in the second direction B. In some embodiments of the disclosure, the second trench 101 does not penetrate through the substrate 11 in the direction perpendicular to the substrate 11, that is, the material of the substrate 11 is still retained at the bottom portion of the second trench 101. For example, the depth of the second trench 101 in the direction perpendicular to the substrate 11 may be smaller than or equal to the depth of the first trench, which is not specifically limited herein.

In an exemplary embodiment of the disclosure, with reference to FIG. 2 and FIG. 3, multiple groups of supporting pillars 110, which are spaced apart from each other in the first direction A, may be formed within the substrate 11 by each second trench 101 and each first trench. For example, supporting pillars 110 in each group may be equally spaced apart from each other in the first direction A, and the multiple groups of supporting pillars 110 may be spaced apart from each other in the second direction B. For example, multiple groups of supporting pillars 110 may be equally spaced apart from each other in the second direction B.

In an exemplary embodiment of the disclosure, the operation that the base 1 is etched to form the plurality of second trenches 101 spaced apart from each other in the second direction B (i.e. S120) may include S310 to S350.

In S310, a mask layer 6 is formed on the surface of the base 1.

In embodiments of the disclosure, the mask layer 6 may be formed on the surface of the base 1 by chemical vapor deposition, physical vapor deposition, vacuum evaporation, magnetron sputtering, atomic layer deposition or other methods. The mask layer 6 may have a multi-layer film structure or a single-layer film structure, and the material of the mask layer may be at least one of polymer, $SiO_2$, SiN, polysilicon and SiCN. Of course, other materials may also be possible, which will not be listed herein.

In some embodiments, the mask layer 6 may have multiple layers, which may include a polymer layer, an oxide layer and a hard mask layer 6. The polymer layer may be formed on the surface of the base 1, and the oxide layer may be located between the hard mask layer 6 and the polymer layer. The polymer layer may be formed on the surface of the base 1 by a chemical vapor deposition process, the oxide layer may be formed on the surface of the polymer layer by a vacuum evaporation process, and the hard mask layer 6 may be formed on the surface of the oxide layer by an atomic layer deposition process.

In S320, a photoresist layer is formed on the surface of the mask layer 6.

The photoresist layer may be formed on the surface of the mask layer 6 away from the base 1 by spin coating or other methods. The material of the photoresist layer may be a positive photoresist or a negative photoresist, which is not specifically limited herein.

In S330, the photoresist layer is exposed and developed to form a plurality of developing regions spaced apart from each other.

The photoresist layer may be exposed by using a mask, and the pattern of the mask may match to the pattern required for the second trench 101. Subsequently, the exposed photoresist layer may be developed to form the plurality of developing regions spaced apart from each other. Each of the developing regions may expose the surface of the mask layer 6, and the pattern of the developing region may be the same as the pattern required for the second trench 101, and the dimension of the developing region may be the same as the dimension required for the second trench 101.

In S340, the mask layer 6 is etched in the developing regions to form a plurality of mask patterns spaced apart from each other in the second direction B, in which an orthographic projection of the mask pattern on the substrate 11 traverses the plurality of the first trenches.

The mask layer 6 may be etched in each developing region by an anisotropic etching process. The etched region can expose the base 1, so as to form a plurality of mask patterns on the mask layer 6. The mask pattern may be strip-shaped and may intersect with the extension direction of the first trench, and the orthographic projection of each of the mask patterns on the base 1 may respectively traverse the plurality of first trenches. For example, the mask pattern may be a strip-shaped pattern extending in the first direction A, and the plurality of mask patterns may be spaced apart from each other in the second direction B.

It should be noted that, the mask pattern may be formed by a single etching process when the mask layer 6 has a single-layer structure. Each of the layers may be etched by layers when the mask layer 6 has a multi-layer structure. That is, one layer may be etched by a single etching process, and the mask layer 6 may be etched through by multiple etching processes to form the mask patterns. In one embodiment, the shape and dimension of the mask pattern may be the same as the pattern and dimension required for each second trench 101.

It should be noted that after the above etching process is completed, the photoresist layer may be removed by cleaning with a cleaning solution or by ashing, such that the etched mask layer 6 is no longer covered by the photoresist layer.

In S350, the base 1 is anisotropic etched by using the mask layer 6 provided with the mask patterns as a mask, so as to form a plurality of second trenches 101, in which each of the plurality of second trenches extends in the first direction A, and the plurality of second trenches are spaced apart from each other in the second direction B.

The base 1 may be anisotropic etched by using the mask layer 6 provided with the mask patterns as a mask, so as to form a plurality of second trenches 101, in which each second trench extends in the first direction A, and the plurality of second trenches are spaced apart from each other in the second direction B. In some embodiments of the disclosure, the second trench 101 is perpendicular to the first trench. The substrate 11 may be divided into a plurality of supporting pillars 110 distributed in an array by the first trenches and the second trenches 101, and the supporting pillars 110 may be arranged in rows and columns. The mask layer 6 does not need to be removed after each of the second trenches 101 is formed, so as to be used in the subsequent etching process to form a third trench, so that formation of the mask layer 6 for the trench used to accommodate the bit line structure 5 may be avoided, thereby simplifying the process and reducing the manufacturing cost.

With reference to FIG. 1, in S130, a word line structure is formed in each of the plurality of second trenches.

Figure 4:
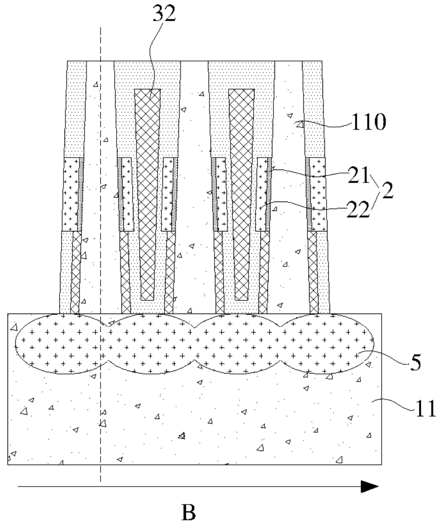
FIG. 4 is a schematic diagram of a word line structure according to an embodiment of the disclosure taken along a second direction.

As shown in FIG. 4, each of the second trenches 101 may be filled with a conductive material, so as to form the word line structure 2 in each of the second trenches 101. In some embodiments of the disclosure, the word line structure 2 may be formed in each of the second trenches 101 in one-to-one correspondence. That is, there may be a plurality of word line structures 2, and the number of the word line structures 2 is equal to the number of the second trenches 101. Each of the word line structures 2 may extend in the first direction A, and the plurality of word line structures 2 may be spaced apart from each other in the second direction B.

In an exemplary embodiment of the disclosure, an insulating layer 3 configured to subsequently isolate each word line structure 2 may be formed before the word line structures 2 are formed. For example, the operation that the insulating layer 3 is formed may include S410 to S480.

In S410, a protective layer 31 adaptively attached to a sidewall of each of the plurality of second trenches 101 are formed.

Figure 5:
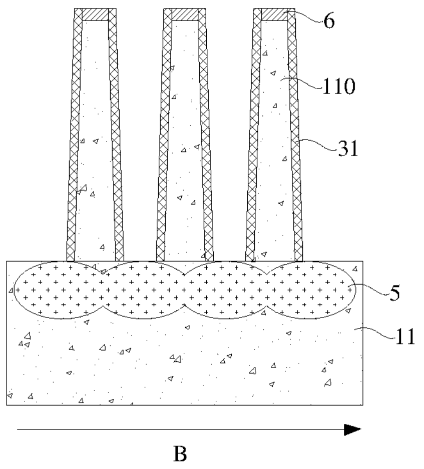
FIG. 5 is a schematic diagram of a protective layer according to an embodiment of the disclosure.

As shown in FIG. 5, the protective layer 31 adaptively attached to the sidewall of each of the plurality of second trenches 101 may be formed on the sidewall of each of the plurality of second trenches 101 by vacuum evaporation, magnetron sputtering, chemical vapor deposition, physical vapor deposition, atomic layer deposition or the like. The surface of the sidewall of each second trench 101 may be protected by the protective layer 31, so as to prevent the surface of the sidewall of the second trench 101 exposed to the outside from being damaged in a subsequent process. The material of the protective layer 31 may be an insulating material, which may be the same as that of the insulating dielectric layer 12. For example, the material of the protective layer 31 may be silicon nitride or silicon oxide, etc., which is not specifically limited herein.

In an exemplary embodiment of the disclosure, the method in the disclosure may further include the following operation.

In S160, a bit line structure 5 is formed at a bottom portion of each of the plurality of second trenches 101 before the plurality of word line structures 2 are formed, in which the bit line structure 5 traverses the plurality of second trenches 101, and the bit line structure 5 is insulated from the plurality of word line structures 2.

In some embodiments of the disclosure, with reference to FIG. 5, the third trench (not shown in the figure) may be formed through the second trench 101, after the protective layer 31 is formed. In this process, the specific forming position of the third trench may be defined by each of the second trenches 101, so as to improve the alignment accuracy of the third trench. The third trench may be located at the bottom portion of the second trench 101, and communicate with the bottom portion of the second trench 101. In some embodiments of the disclosure, the third trench may penetrate through the bottom portions of the plurality of second trenches 101. There may be a plurality of third trenches. Each of the plurality of third trenches may extend in the second direction B, and the plurality of third trenches may be spaced apart from each other in the first direction A.

In an exemplary embodiment of the disclosure, the operation that the bit line structure 5 is formed at the bottom portion of each of the plurality of second trenches 101 may include S1601 and S1602.

In S1601, a portion of a material of the substrate 11 located below the plurality of second trenches 101 is removed to form a third trench below the plurality of second trenches 101, in which the third trench penetrates through the plurality of second trenches 101.

The substrate 11 located at the bottom portion of the second trench 101 may be etched to form the third trench. The third trench may extend in the second direction B, and the third trench may communicate the bottom portions of the second trenches 101 with each other in the second direction B. That is, the third trench may hollow the bottom portion of each of the supporting pillars 110 spaced apart from each other in the second direction B, so that the bottom portions of the second trenches 101 spaced apart from each other in the second direction B may be communicated with each other through the third trench. In this case, each of the supporting pillars 110 may be supported by the insulating dielectric layer 12 between respective supporting pillars 110, so as to avoid collapse of the supporting pillar 110, thereby improving the product yield. In the process, the specific forming position of the third trench may be defined by each of the second trenches 101, thereby improving the alignment accuracy of the third trench.

It should be noted that in the process of forming the third trench, the bottom portion of the second trench 101 may be further etched by using the mask layer 6 for forming the second trench 101 as a mask, so as to form the third trench for penetrating through each of the second trenches 101, so that the formation of the mask layer 6 for the trench used to accommodate the bit line structure 5 may be avoided, thereby simplifying the process and reducing the manufacturing cost.

In S1602, a second conductive material is filled within the third trench to form the bit line structure 5.

The third trench may be filled with the second insulating material by vacuum evaporation, magnetron sputtering, chemical vapor deposition, physical vapor deposition, atomic layer deposition or the like. Of course, the third trench may be filled with the second conductive material by other methods, so as to form the bit line structure 5 in the third trench.

In some embodiments of the disclosure, in the process of filling the second conductive material, for the convenience of the process, the second conductive material may be simultaneously deposited on the surface of the mask layer 6, and the deposition is stopped after the third trench is completely filled with the second conductive material. The second conductive material located outside the third trench may be removed by an etching process, and only the second conductive material located within the third trench is retained, so as to form the bit line structure 5 only within the third trench.

In an exemplary embodiment of the disclosure, the second conductive material may be a material having strong metallicity, by which the contact resistance of the resulting bit line structure 5 may be reduced. For example, the material of the second conductive material may be titanium nitride or silicon cobaltide.

In some embodiments of the disclosure, a bit line structure 5 may be formed in each third trench in one-to-one correspondence. That is, there may be a plurality of bit line structures 5, and the number of the bit line structures 5 is equal to the number of the third trenches. Each of the bit line structures 5 may extend in the second direction B, and the plurality of bit line structures 5 may be spaced apart from each other in the first direction A.

In S420, a first insulating material layer 3311 is formed on a surface of a structure collectively formed by the base 1 and the protective layer 31.

Figure 6:
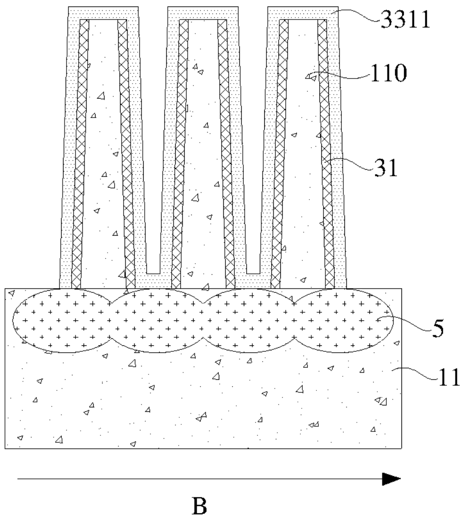
FIG. 6 is a schematic diagram of a first insulating material layer according to an embodiment of the disclosure.

With reference to FIG. 6, the first insulating material layer 3311 may be formed on the surface of the structure collectively formed by the substrate 11 and the protective layer 31 by chemical vapor deposition, physical vapor deposition, atomic layer deposition or the like. It should be noted that when the bit line structure 5 is formed at the bottom portion of the substrate 11, the first insulating material layer 3311 may be simultaneously formed on the surface of the bit line structure 5, so that the bit line structure 5 may be insulated and isolated from the word line structure 2 subsequently formed in the second trench 101 by the first insulating material layer 3311, thereby avoiding coupling or short circuit between the bit line structure 5 and the word line structure 2 subsequently formed, which may improve the product yield.

In some embodiments of the disclosure, the thickness of the first insulating material layer 3311 may range from 2 nm to 5 nm. For example, the thickness of the first insulating material layer 3311 may be 2 nm, 3 nm, 4 nm or 5 nm. Of course, the thickness of the first insulating material layer 3311 may also be other values, which will not be listed herein.

In some embodiments of the disclosure, the material of the first insulating material layer 3311 may be different from the material of the protective layer 31. For example, the material of the first insulating material layer 3311 may be silicon nitride. Of course, the material of the first insulating material layer 3311 may be other materials, which is not specifically limited herein.

In S430, a first insulating layer 32 is formed within each of the plurality of second trenches 101 provided with the first insulating material layer 3311, in which a top portion of the first insulating layer 32 is lower than a top portion of the first insulating material layer 3311.

Figure 7:
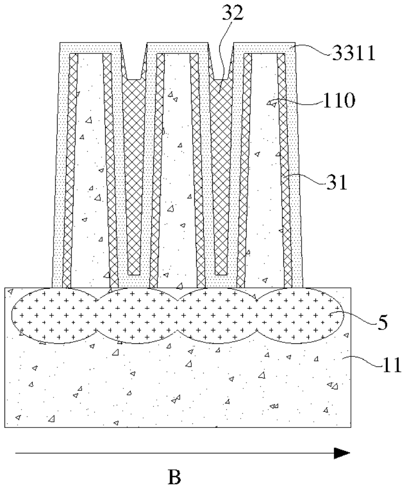
FIG. 7 is a schematic diagram of a first insulating layer according to an embodiment of the disclosure.

As shown in FIG. 7, the second trench 101 provided with the protective layer 31 and the first insulating material layer 3311 may be filled with the insulating material, so as to form the first insulating layer 32 in the second trench 101. For example, the first insulating layer 32 may be formed within the second trench 101 by chemical vapor deposition, physical vapor deposition or atomic layer deposition. In this process, for the convenience of the process, in the process of forming the first insulating layer 32, the insulating material may be simultaneously deposited in the second trench 101 and on the surface of the first insulating material layer 3311 located on the top portion of the second trench 101, and then the deposited insulating material may be etched back, so that the top portion of the first insulating layer 32 is lower than the top portion of the first insulating material layer 3311. In this process, the insulating material on the surface of the first insulating material layer 3311 located on the top portion of the second trench 101 may be synchronously removed, and only the insulating material located within the second trench 101 is retained, so as to form the first insulating layer 32 within the second trench 101.

In some embodiments of the disclosure, the depth by which the insulating material is etched back may range from 15 nm to 25 nm, that is, the height difference between the top portion of the first insulating layer 32 and the top portion of the first insulating material layer 3311 may range from 15 nm to 25 nm. For example, the height difference between the top portion of the first insulating layer 32 and the top portion of the first insulating material layer 3311 may be 15 nm, 18 nm, 21 nm, 24 nm or 25 nm. Of course, other height differences may also be possible, which will not be listed herein.

In some embodiments of the disclosure, the material of the first insulating layer 32 may be different from the material of the first insulating material layer 3311. For example, the material of the first insulating layer 32 may be silicon oxide, and the material of the first insulating material layer 3311 may be silicon nitride.

In S440, a second insulating material layer is formed on the top portion of the first insulating layer 32.

The second insulating material layer (not shown in the figure) may be formed on the top portion of the first insulating layer 32, after the first insulating layer 32 is formed. The material of the second insulating material layer may be the same as that of the first insulating material layer 3311. The second insulating material layer may be in contact with the first insulating material layer 3311, and the first insulating layer 32 may be completely coated by the second insulating material layer and the first insulating material layer 3311.

The second insulating material layer may be formed on the top portion of the first insulating layer 32 by chemical vapor deposition, physical vapor deposition or atomic layer deposition. In this process, for the convenience of the process, the second insulating material layer may be simultaneously deposited on the surface of the first insulating material layer 3311.

In S450, a surface of the second insulating material layer is planarized, so as to allow a top portion of the second insulating material layer to be flush with a surface of the substrate 11, in which a remaining portion of the second insulating material layer and the first insulating material layer 3311 collectively form a second insulating layer 331.

Figure 8:
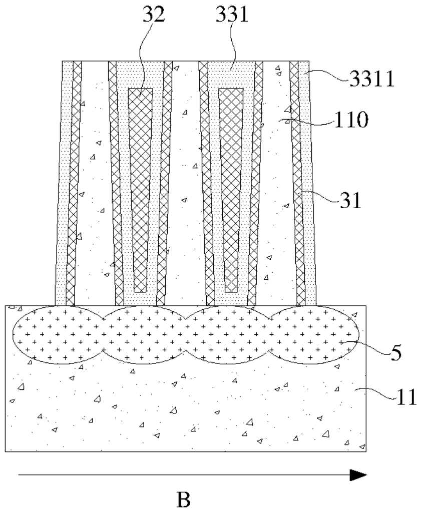
FIG. 8 is a schematic diagram of a second insulating layer according to an embodiment of the disclosure.

The surface of the second insulating material layer may be ground or polished by a chemical mechanical grinding process, until the first insulating material layer 3311 and the second insulating material layer located at the top portion of the substrate 11 are completely removed. In the process, both the top portion of the second insulating material layer and the top portion of the first insulating material layer 3311 may be flush with the surface of the substrate 11. In some embodiments of the disclosure, as shown in FIG. 8, the remaining portion of the second insulating material layer and the first insulating material layer 3311 may collectively form the second insulating layer 331, that is, the first insulating layer 32 may be completely coated by the second insulating layer 331.

In S460, the protective layer 31 and the insulating dielectric layer 12 are etched back to form an insulating gap 302.

Figure 9:
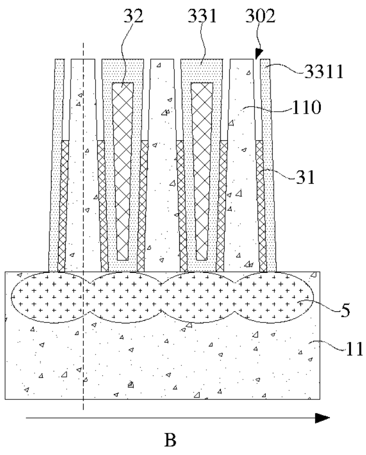
FIG. 9 is a schematic diagram taken along a second direction after completing S460 according to an embodiment of the present disclosure.
Figure 10:
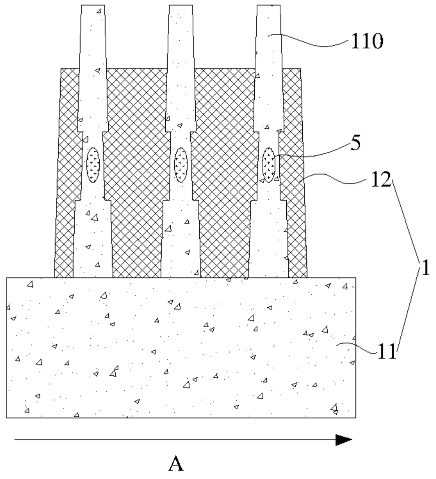
FIG. 10 is a schematic diagram taken along a dotted line in FIG. 9 after completing S460 according to an embodiment of the present disclosure.

As shown in FIG. 9 and FIG. 10, the protective layer 31 and the insulating dielectric layer 12 may be etched back to form the insulating gap 302 between the second insulating layer 331 and the sidewall of the second trench 101. In some embodiments, in the process of etching back, a portion of the protective layer 31 may be removed, rather than the entire protective layer 31. Specifically, the protective layer 31 located at an end farther away from the bit line structure 5 may be removed, while the protective layer 31 located at an end closer to the bit line structure 5 may be retained. Meanwhile, the thickness of the insulating dielectric layer 12 may be thinned, so that the top portion of the insulating dielectric layer 12 is lower than the top portion of each of the supporting pillars 110. In some embodiments, the removed thickness of the insulating dielectric layer 12 may be equal to the thickness of the protective layer 31 removed in the direction perpendicular to the substrate 11.

It should be noted that, the width of the insulating gap 302 formed between the second insulating layer 331 and the sidewall of the second trench 101 after removing the protective layer 31 may be much smaller than the spacing between adjacent supporting pillars 110 after removing the insulating dielectric layer 12.

In S470, an insulating material is filled in the insulating gap 302, in which the insulating material and the second insulating layer 331 collectively form a passivation layer 33.

Figure 11:
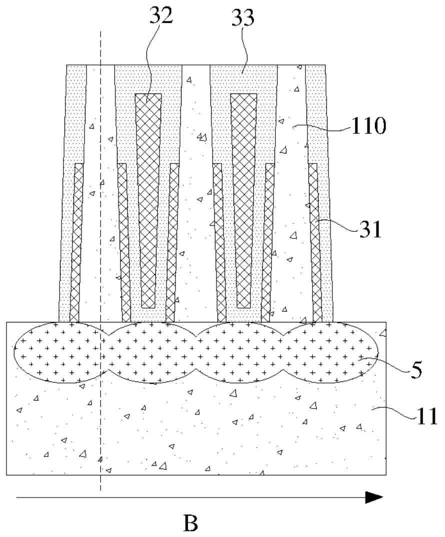
FIG. 11 is a schematic diagram taken along a second direction after completing S470 according to an embodiment of the present disclosure.
Figure 12:
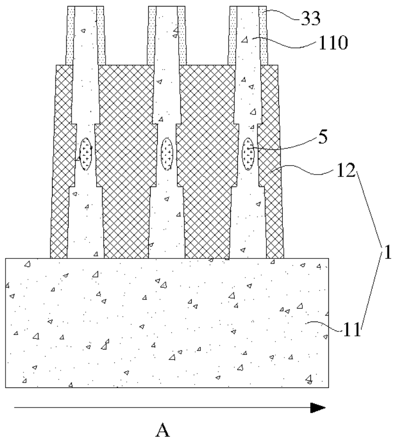
FIG. 12 is a schematic diagram taken along a dotted line in FIG. 11 after completing S470 according to an embodiment of the present disclosure.

The insulating gap 302 may be filled with the insulating material by chemical vapor deposition, physical vapor deposition or atomic layer deposition. In order to accurately locate the position of the word line structure 2 subsequently, the insulating gap 302 may be completely filled with the insulating material. For the convenience of the process, in the process of depositing the insulating material, the insulating material may be simultaneously deposited on the surface of the remaining insulating dielectric layer 12. In this process, since the width of the insulating gap 302 is much smaller than the spacing between adjacent supporting pillars 110 after removing the insulating dielectric layer 12, a thin layer of insulating material may be only formed on the exposed surface of the sidewall of each of the supporting pillars 110 after the insulating gap 302 is completely filled, and the gap between adjacent supporting pillars 110 will not be completely filled, so that the surface of the insulating dielectric layer 12 may be exposed. The cross-sectional view taken along the second direction B after completing S470 is shown in FIG. 11, and the cross-sectional view taken along the first direction A after completing S470 is shown in FIG. 12.

The insulating material may be the same as the material of the second insulating layer 331, and the insulating material located in the insulating gap 302 and the second insulating layer 331 may collectively form the passivation layer 33.

In S480, a preset thickness of the protective layer 31 is removed in a direction perpendicular to the substrate 11 to form a plurality of word line filling trenches 201, in which a bottom portion of each of the plurality of second trenches 101 is unexposed by a respective one of the plurality of word line filling trenches 201.

Figure 13:
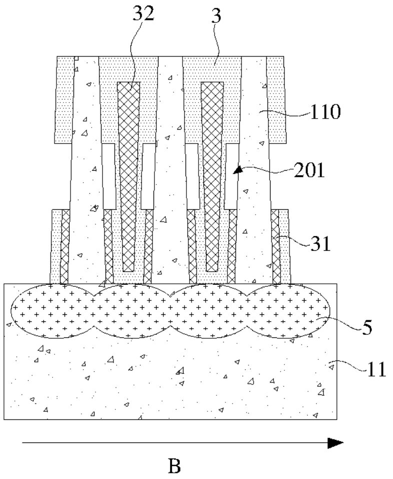
FIG. 13 is a schematic diagram taken along a second direction after completing S480 according to an embodiment of the present disclosure.

As shown in FIG. 13, a portion of the protective layer 31 located on the sidewall of the second trench 101 may be removed by a wet etching process, so as to form a word line filling trench 201 for receiving the word line structure 2. In this process, the protective layer 31 may be etched through the exposed surface of the insulating dielectric layer 12. For example, the exposed surface of the insulating dielectric layer 12 may be etched with a dilute hydrofluoric acid (DHF), so as to hollow out a space in the insulating dielectric layer 12 downward. This space may extend laterally and expose the protective layer 31. Since the material of the protective layer 31 is the same as that of the insulating dielectric layer 12, the exposed protective layer 31 may be further etched with the dilute hydrofluoric acid (DHF), so as to remove a portion of the protective layer 31 located on the sidewall of the second trench 101, so as to expose the sidewall of each of the supporting pillars 110.

For example, the insulating dielectric layer 12 and the protective layer 31 may be cleaned by using a mixture of HF with a concentration of 49% and deionized water. The ratio of HF to deionized water may range from 1:500 to 1:2000. For example, the ratio may be 1:500, 1:1000, 1:1500 or 1:2000. Of course, other ratios may also be possible, which will not be listed herein. In the process of wet etching, the protective layer 31 located at the bottom portion of the second trench 101 may be retained. For example, the protective layer 31 covering the surface of the bit line structure 5 may be retained, so that the bit line structure 5 may be insulated and isolated from the word line structure 2 subsequently formed in the word line filling trench 201 by the remaining portion of the protective layer 31, thereby avoiding short circuit or coupling between the word line structure 2 and the bit line structure 5. That is, the protective layer 31 is located between the bit line structure 5 and the word line structure 2, and the bit line structure 5 is insulated from the word line structure 2 by the protective layer 31. The passivation layer 33 and the remaining portion of the protective layer 31 may collectively form the insulating layer 3 in the disclosure.

Each of the plurality of word line structures 2 may be formed within a respective one of the plurality of word line filling trenches 201 after the insulating layer 3 is formed. In an exemplary embodiment of the disclosure, the operation that the plurality of word line structures 2 are formed may include S510 and S520.

In S510, an inter-gate dielectric layer 21 is formed at a bottom portion of each of the plurality of word line filling trenches 201 and on a sidewall of each of the plurality of word line filling trenches 201 away from the insulating layer 3.

The material of the inter-gate dielectric layer 21 may include silicon oxide, silicon nitride, silicon oxynitride, or the like, or a combination of the foregoing materials. The thickness of the inter-gate dielectric layer 21 may range from 1 nm to 9 nm, for example, the thickness of the inter-gate dielectric layer may be 1 nm, 2 nm, 4 nm, 6 nm, 8 nm, or 9 nm. Of course, other thicknesses may also be possible, which will not be listed herein.

Figure 14:
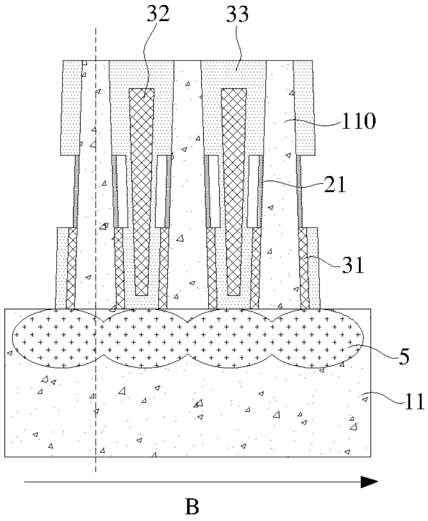
FIG. 14 is a schematic diagram taken along a second direction after completing S510 according to an embodiment of the present disclosure.
Figure 15:
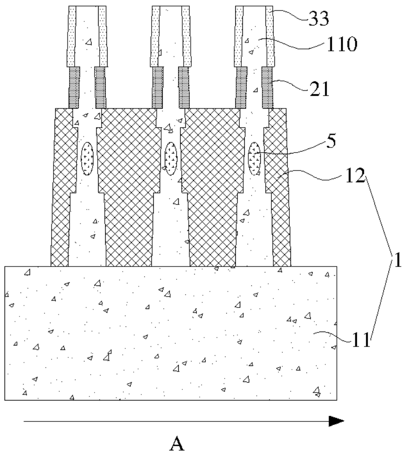
FIG. 15 is a schematic diagram taken along a dotted line in FIG. 14 after completing S510 according to an embodiment of the present disclosure.

For example, as shown in FIG. 14 and FIG. 15, the adaptively attached inter-gate dielectric layer 21 may be formed at the bottom portion of each word line filling trench 201 and on the sidewall of each word line filling trench 201 away from the insulating layer 3 by chemical vapor deposition, physical vapor deposition, atomic layer deposition, thermal evaporation, thermal oxidation or the like. Of course, the inter-gate dielectric layer 21 may also be formed by other methods, which is not specifically limited herein. It should be noted that the inter-gate dielectric layer 21 can be adaptively attached to the exposed sidewalls of each of the supporting pillars 110, so as to facilitate the subsequent formation of a gate-all-around structure.

In some embodiments of the disclosure, the surface of the inter-gate dielectric layer 21 may be treated by a thermal oxidation process, so as to improve the film compactness of the inter-gate dielectric layer 21, thereby reducing the leakage current, improving the gate controlling capability, and enhancing the barrier effect of the inter-gate dielectric layer 21 on the impurities in the substrate 11, thereby preventing the impurities in the substrate 11 from diffusing into the word line filling trenches 201, which may improve the structural stability.

In S520, a first conductive material 22 is filled within each of the plurality of word line filling trenches 201 provided with the inter-gate dielectric layer 21 to form the plurality of word line structures 2.

Figure 16:
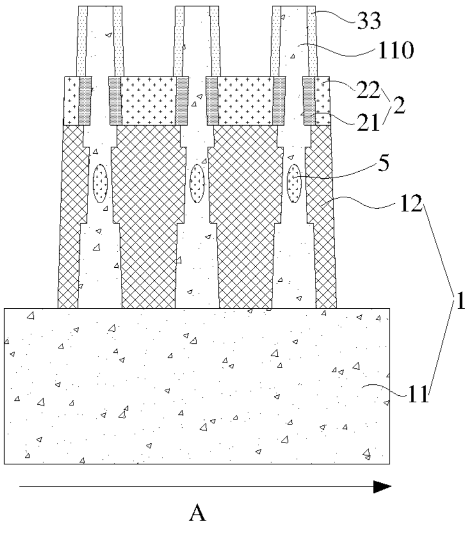
FIG. 16 is a schematic diagram taken along a dotted line in FIG. 4 after completing S520 according to an embodiment of the present disclosure.

As shown in FIG. 4 and FIG. 16, the word line filling trenches 201 may be filled with the first conductive material 22, and each of the word line filling trenches 201 may be completely filled with the first conductive material 22, and the first conductive material 22 may be in contact with the inter-gate dielectric layer 21 on the surface of each of the supporting pillars 110. The first conductive material 22 may be tungsten, titanium nitride or the like. Of course, other materials with strong conductive properties may also be possible, which will not be listed herein.

For example, the first conductive material 22 may be deposited on the surface of the structure collectively formed by the second trenches 101 and respective supporting pillars 110 provided with the inter-gate dielectric layer 21 by chemical vapor deposition, physical vapor deposition, atomic layer deposition, vacuum evaporation, magnetron sputtering, thermal evaporation or other processes, so as to form the word line structures 2. Of course, the word line structures 2 may be formed by other methods, which are not specifically limited herein.

In an exemplary embodiment of the disclosure, an insulating layer 3 may be formed between each two adjacent word line structures 2 after the word line structures 2 are formed, so that the adjacent word line structures 2 can be insulated and isolated from each other by the insulating layer 3, thereby avoiding coupling or short circuit between the word line structures 2.

As shown in FIG. 1, in S140, an air gap is formed between each two adjacent word line structures.

Figure 17:
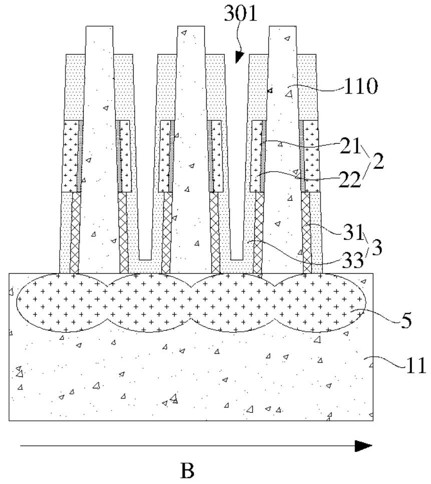
FIG. 17 is a schematic diagram taken along a second direction after completing S140 according to an embodiment of the present disclosure.

As shown in FIG. 17, the air gap 301 may be formed between each two adjacent word line structures 2. For example, the air gap 301 may be located within the insulating layer 3 between two adjacent word line structures 2. Since the dielectric constant of the air gap 301 is relatively small, the parasitic capacitance between the word line structures 2 may be effectively reduced, and the power consumption of the device may be reduced.

In an exemplary embodiment of the disclosure, the operation that the air gap 301 is formed may include S610 and S620.

In S610, the passivation layer 33 is etched back after the plurality of word line structures 2 are formed, until the first insulating layer 32 is exposed.

Figure 18:
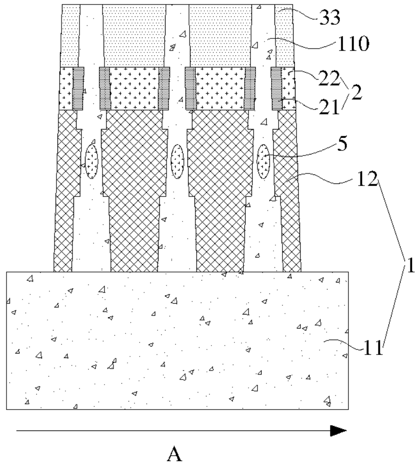
FIG. 18 is a schematic diagram taken along a first direction after backfilling an insulating material according to an embodiment of the disclosure.

In some embodiments of the disclosure, as shown in FIG. 18, an insulating material may be deposited on the exposed surface of the word line structure 2 after the word line structure 2 is formed, so as to insulate the exposed surface of the word line structure 2, thereby avoiding coupling or short circuit between the word line structure 2 and other structures subsequently formed, which is beneficial to improve the product yield. The insulating material may be the same as the material of the passivation layer 33, for example, the insulating material may be silicon nitride.

Figure 19:
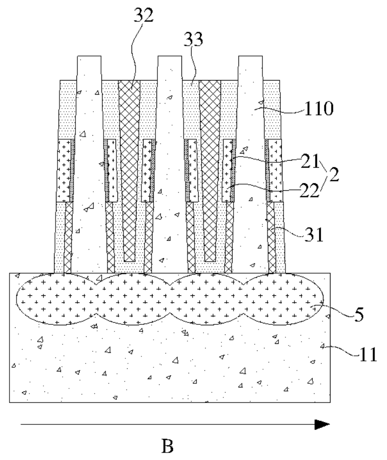
FIG. 19 is a schematic diagram taken along a second direction after completing S610 according to an embodiment of the present disclosure.

For example, the insulating material may be deposited on the exposed surface of the word line structure 2 by chemical vapor deposition, physical vapor deposition, atomic layer deposition, thermal evaporation or the like, and the gap between the supporting pillars 110 may be at least completely filled with the insulating material. In this process, for convenience of the process, the insulating material may be simultaneously deposited on the top portion of each of the supporting pillars 110, and then the insulating material may be planarized by a polishing or grinding process, so as to remove the insulating material on the top portion of each supporting pillar 110, and to expose the top portion of each supporting pillar 110. The passivation layer 33 may subsequently be etched back (as shown in FIG. 19), until the top portion of the first insulating layer 32 is exposed, so as to facilitate subsequent removal of the first insulating layer 32.

In S620, the first insulating layer 32 is removed to form the air gap 301.

With reference to FIG. 17, the first insulating layer 32 may be removed by an etching process, so as to form the air gap 301 in the insulating layer 3. The width of the air gap 301 may be equal to the width of the first insulating layer 32. For example, the width of the air gap 301 may range from 1 nm to 15 nm. For example, the width of the air gap 301 may be 1 nm, 3 nm, 6 nm, 9 nm, 12 nm or 15 nm. Of course, other widths may also be possible, which are not specifically limited herein.

In an exemplary embodiment of the disclosure, the first insulating layer 32 may be selectively etched by using an acidic solution, so as to remove the first insulating layer 32. In this process, the material of the first insulating layer 32 is different from the material of the passivation layer 33, and the first insulating layer 32 has a high etching selectivity ratio. For example, the etching selectivity ratio of the first insulating layer 32 to the passivation layer 33 may be 10:1. In some embodiments of the disclosure, the acidic solution may be hydrofluoric acid.

With reference to FIG. 1, in S150, the air gap is sealed.

The air gap 301 may be sealed, so as to prevent the resulting semiconductor structure from breaking at the opening of the air gap 301, thereby improving the product yield.

Figure 20:
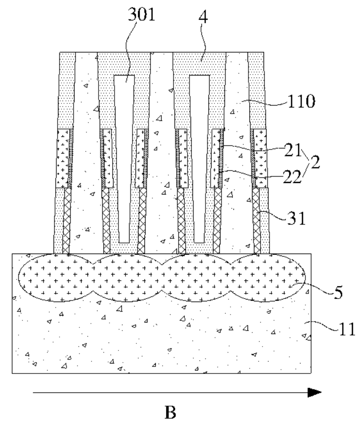
FIG. 20 is a schematic diagram taken along a second direction after completing S150 according to an embodiment of the present disclosure.

In an exemplary embodiment of the disclosure, as shown in FIG. 20, the operation that the air gap 301 is sealed may include the following operation. A sealing layer 4 is formed on a surface of the passivation layer 33 provided with the air gap 301, in which the sealing layer 4 at least covers an opening of the air gap 301.

The sealing layer 4 may be located on the surface of the remaining portion of the passivation layer 33, and the opening of the air gap 301 may be at least completely filled with the sealing layer 4, so as to seal the opening of the air gap 301. For example, the sealing layer 4 may be formed on the surface of the passivation layer 33 by chemical vapor deposition, physical vapor deposition, atomic layer deposition, vacuum evaporation or magnetron sputtering. The material of the sealing layer 4 may be an insulating material, for example, silicon nitride. The thickness of the sealing layer 4 may be set according to actual requirements, which is not specifically limited herein.

It should be noted that although each operation of the method for forming the semiconductor structure in the disclosure is described in a specific order in the accompanying drawings, it is not required or implied that these operations must be performed in that specific order, or that all the shown operations must be performed in order to achieve the desired results. Additionally or alternatively, certain operations may be omitted, multiple operations may be merged into one operation for execution, and/or one operation may be decomposed into multiple operations for execution, etc.

The disclosure further provides a semiconductor structure. FIG. 20 shows a schematic diagram of a semiconductor structure according to the disclosure. With reference to FIG. 20, the semiconductor structure may include a base 1, a plurality of word line structures 2, and a sealing layer 4.

The base 1 includes a substrate 11 and an insulating dielectric layer 12. The substrate 11 includes a plurality of first trenches spaced apart from each other in a first direction A and a plurality of second trenches 101 spaced apart from each other in a second direction B. The insulating dielectric layer 12 is filled in each of the plurality of first trenches, and each of the plurality of second trenches 101 penetrates through each of the plurality of first trenches and the insulating dielectric layer 12 inside each of the plurality of first trenches. The second direction B intersects with the first direction A.

Each of the plurality of word line structures 2 is formed in a respective one of the plurality of second trenches 101, and an air gap 301 is formed between each two adjacent word line structures 2 of the plurality of word line structures 2.

The sealing layer 4 at least covers an opening of the air gap 301.

According to the semiconductor structure in the disclosure, on the one hand, the word line structure 2 is buried in the second trench 101, which is beneficial to save the structure space, and to improve the device integration. On the other hand, an air gap 301 may be formed between two adjacent word line structures 2. Due to the smaller dielectric constant of the air gap 301, the parasitic capacitance between the word line structures 2 can be effectively reduced, and the power consumption of devices can be reduced. On still the other hand, the air gap 301 can be sealed between two adjacent word line structures 2 by sealing the air gap 301 with the sealing layer 4, so as to prevent the resulting semiconductor structure from breaking at the opening of the air gap 301, thereby improving the product yield.

The semiconductor structure in the disclosure may be formed by the method for forming the semiconductor structure in any of the above embodiments, and the specific details and beneficial effects thereof may refer to the above embodiments of the method for forming the semiconductor structure, which will not be repeated herein.

Embodiments of the disclosure further provide a memory, which may include the semiconductor structure in any of the above embodiments. The specific details, forming process and beneficial effects of the memory have been described in detail in the corresponding semiconductor structure and the method for forming the semiconductor structure, which will not be repeated herein.

For example, the memory may be a Dynamic Random Access Memory (DRAM), a Static Random Access Memory (SRAM), or the like. Of course, other storage devices may also be possible, which will not be listed herein.

According to the semiconductor structure, the method for forming the semiconductor structure and the memory in the disclosure, on the one hand, the second trench is formed in the substrate, and the word line structure is buried in the second trench, which is beneficial to save the structure space, and to improve the device integration. On the other hand, an air gap may be formed between two adjacent word line structures. Due to the smaller dielectric constant of the air gap, the parasitic capacitance between the word line structures can be effectively reduced, and the power consumption of devices can be reduced. On still the other hand, the air gap can be sealed between two adjacent word line structures by sealing the air gap, so as to prevent the resulting semiconductor structure from breaking at the opening of the air gap, thereby improving the product yield.

Other embodiments of the disclosure will be apparent to those of ordinary skill in the art from consideration of the specification and practice of the disclosure disclosed herein. The disclosure is intended to cover any variations, uses, or adaptations of the disclosure, following the general principles thereof, and including common knowledge or conventional technical means in the art that are not disclosed in the disclosure. The specification and embodiments are considered as exemplary only, with a true scope and spirit of the disclosure being indicated by the appended claims.

The invention claimed is:

1. A method for forming a semiconductor structure, comprising:

providing a base, wherein the base comprises a substrate and an insulating dielectric layer, the substrate comprises a plurality of first trenches spaced apart from each other in a first direction, and the insulating dielectric layer is filled in each of the plurality of first trenches;

patterning and etching the base to form a plurality of second trenches spaced apart from each other in a second direction, wherein the second direction intersects with the first direction;

forming a word line structure in each of the plurality of second trenches;

forming an air gap between each two adjacent word line structures of a plurality of word line structures; and sealing the air gap;

forming an insulating layer between said each two adjacent word line structures of the plurality of word line structures, wherein the air gap is located within the insulating layer;

wherein forming the insulating layer comprises:

forming a protective layer adaptively attached to a sidewall of each of the plurality of second trenches;

forming a first insulating material layer on a surface of a structure collectively formed by the base and the protective layer;

forming a first insulating layer within each of the plurality of second trenches provided with the first insulating material layer, wherein a top portion of the first insulating layer is lower than a top portion of the first insulating material layer;

forming a second insulating material layer on the top portion of the first insulating layer;

planarizing a surface of the second insulating material layer to allow a top portion of the second insulating material layer to be flush with a surface of the substrate, wherein a remaining portion of the second insulating material layer and the first insulating material layer collectively form a second insulating layer;

etching back the protective layer and the insulating dielectric layer to form an insulating gap;

filling an insulating material in the insulating gap, wherein the insulating material and the second insulating layer collectively form a passivation layer; and removing a preset thickness of the protective layer in a direction perpendicular to the substrate to form a plurality of word line filling trenches, wherein a bottom portion of each of the plurality of second trenches is unexposed by a respective one of the plurality of word line filling trenches.

2. The method according to claim 1, wherein forming the plurality of word line structures comprises:

forming an inter-gate dielectric layer at a bottom portion of each of the plurality of word line filling trenches and on a sidewall of each of the plurality of word line filling trenches away from the insulating layer; and filling a first conductive material within each of the plurality of word line filling trenches provided with the inter-gate dielectric layer to form the plurality of word line structures.

3. The method according to claim 1, wherein forming the air gap comprises:

etching back the passivation layer after forming the plurality of word line structures, until the first insulating layer is exposed; and removing the first insulating layer to form the air gap.

4. The method according to claim 3, wherein sealing the air gap comprises:

forming a sealing layer on a surface of the passivation layer provided with the air gap, wherein the sealing layer at least covers an opening of the air gap.

5. The method according to claim 1, further comprising:

forming a bit line structure at the bottom portion of each of the plurality of second trenches before forming the plurality of word line structures, wherein the bit line structure traverses the plurality of second trenches, and the bit line structure is insulated from the plurality of word line structures.

6. The method according to claim 5, wherein forming the bit line structure comprises:

removing a portion of the substrate located below the plurality of second trenches to form a third trench below the plurality of second trenches, wherein the third trench penetrates through the plurality of second trenches; and filling a second conductive material within the third trench to form the bit line structure.

7. The method according to claim 5, wherein the protective layer is located between the bit line structure and the plurality of word line structures, and the bit line structure is insulated from the plurality of word line structures by the protective layer.

* * * * *